United States Patent
Inaba et al.

(10) Patent No.: US 7,570,008 B2
(45) Date of Patent: Aug. 4, 2009

(54) POWER MODULE, POWER CONVERTER, AND ELECTRIC MACHINE SYSTEM FOR MOUNTING IN VEHICLE

(75) Inventors: Masamitsu Inaba, Hitachi (JP); Katsunori Azuma, Hitachi (JP); Mutsuhiro Mori, Mito (JP); Kinya Nakatsu, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 185 days.

(21) Appl. No.: 11/830,051

(22) Filed: Jul. 30, 2007

(65) Prior Publication Data
US 2009/0034306 A1 Feb. 5, 2009

(51) Int. Cl.
*H02P 1/46* (2006.01)
(52) U.S. Cl. .......................... 318/722; 361/33
(58) Field of Classification Search .................. 361/33; 318/140, 722, 800, 801, 802, 803
See application file for complete search history.

(56) References Cited

U.S. PATENT DOCUMENTS

2005/0200425 A1* 9/2005 McKay et al. ................. 333/26
2007/0109715 A1 5/2007 Azuma et al.
2008/0049476 A1 2/2008 Azuma et al.

FOREIGN PATENT DOCUMENTS

JP 2001-274322 A 10/2001

* cited by examiner

*Primary Examiner*—Karen Masih
(74) *Attorney, Agent, or Firm*—Crowell & Moring LLP

(57) ABSTRACT

The present invention provides a power module, power converter, and vehicular electric machine system capable of reducing inductance of a peripheral section of an output terminal in a power module, and additionally, reducing a surge voltage. A positive emitter conductor 3 connected to an emitter electrode of a positive power semiconductor element Mpu and an output terminal U are electrically interconnected by using a plurality of aluminum wires 7, a negative collector conductor 4 connected to a collector electrode of a negative power semiconductor element Mnu and the output terminal U are electrically interconnected by using a plurality of aluminum wires 9, and the positive emitter conductor 3 connected to the emitter electrode of the positive power semiconductor element Mpu and the negative collector conductor 4 connected to the collector electrode of the negative power semiconductor element Mnu are further electrically interconnected by using a plurality of aluminum wires 8.

12 Claims, 10 Drawing Sheets

POWER MODULE, POWER CONVERTER, AND ELECTRIC MACHINE SYSTEM FOR MOUNTING IN VEHICLE

BACKGROUND OF THE INVENTION

1. Field of the Invention

The present invention relates generally to power modules, power converters, and electric machine systems for mounting in vehicles. The invention is directed more particularly to a power module, power converter, and vehicular electric machine system suitable for reducing a switching-associated surge voltage of a power semiconductor.

2. Description of the Related Art

Reduction in the inductance of a conventional power module is known to be achievable by, as described in JP-A-2001-274322, connecting the emitter electrode and output terminal of a positive IGBT chip by wire bonding and the formation of a negative collector pattern.

SUMMARY OF THE INVENTION

The above conventional technology uses an electric power converter, for example, an inverter for mounting in a vehicle, to turn on and off a power semiconductor switch provided inside the power module. During this on/off sequence, a current of several hundreds of amperes is switched, which causes an induced electromotive voltage (surge voltage) due to the parasitic inductance of the main circuit. It is therefore necessary to reduce the internal parasitic inductance of the power module and control the surge voltage below the withstand voltage of the power semiconductor element.

The power module described in JP-A-2001-274322, however, has had the problem that since the current path ranging from the emitter electrode of the positive IGBT chip to the output terminal is too long, the inductance that occurs on the periphery of the output terminal is too high for sufficient reduction in the surge voltage.

An object of the present invention is to provide a power module, power converter, and vehicular electric machine system capable of reducing inductance which occurs particularly on a peripheral section of an output terminal in a power module, and at the same time, reducing a surge voltage.

The present invention makes it possible to reduce inductance that occurs on a peripheral section of an output terminal in a power module, and at the same time, reduce a surge voltage.

One of typical aspects of the present invention provides a power module reduced in parasitic inductance of an output terminal section.

One of typical features of the present invention exists in the above power module in which: a current discharge section of a positive power semiconductor element is electrically connected to an output terminal thereof, a current suction section of a negative power semiconductor element is electrically connected to the output terminal of the positive power semiconductor element, and the current discharge section of the positive power semiconductor element is electrically connected to the current suction section of the negative power semiconductor element.

The present invention also provides an electric power converter including a controller which outputs a control signal for driving the power semiconductor elements of the power module, and the above power module which receives the control signal from the controller to drive a power semiconductor element of a converter.

Additionally, the present invention provides a vehicular electric machine system that uses the above power converter functioning as a controller which converts electric power supplied from a power supply mounted in a vehicle, to a rotating electric machine mounted in the vehicle, into required electric power and controls the vehicle-mounted rotating electric machine.

DETAILED DESCRIPTION OF THE PREFERRED EMBODIMENTS

A configuration of a power module, power converter, and vehicular electric machine system according to a first embodiment of the present invention is described below by using FIGS. 1 to 4.

In the embodiment described below, an inverter for mounting in a vehicle is taken as an example of a power converter in which the power module of the present invention is used. The inverter controls driving of a motor mounted in the vehicle, and is adapted to convert DC power supplied from a battery which is mounted in the vehicle and constitutes a power supply mounted in the vehicle, into AC power and supply the thus-obtained AC power to the motor.

The configuration described below can also be applied to DC-DC power converters such as DC choppers. In addition, the configuration described below can be applied to power converters for industrial, household, and other purposes.

First, a configuration of a vehicle having the vehicular electric machine system according to the present embodiment is described below by using FIG. 1.

Figure 1:
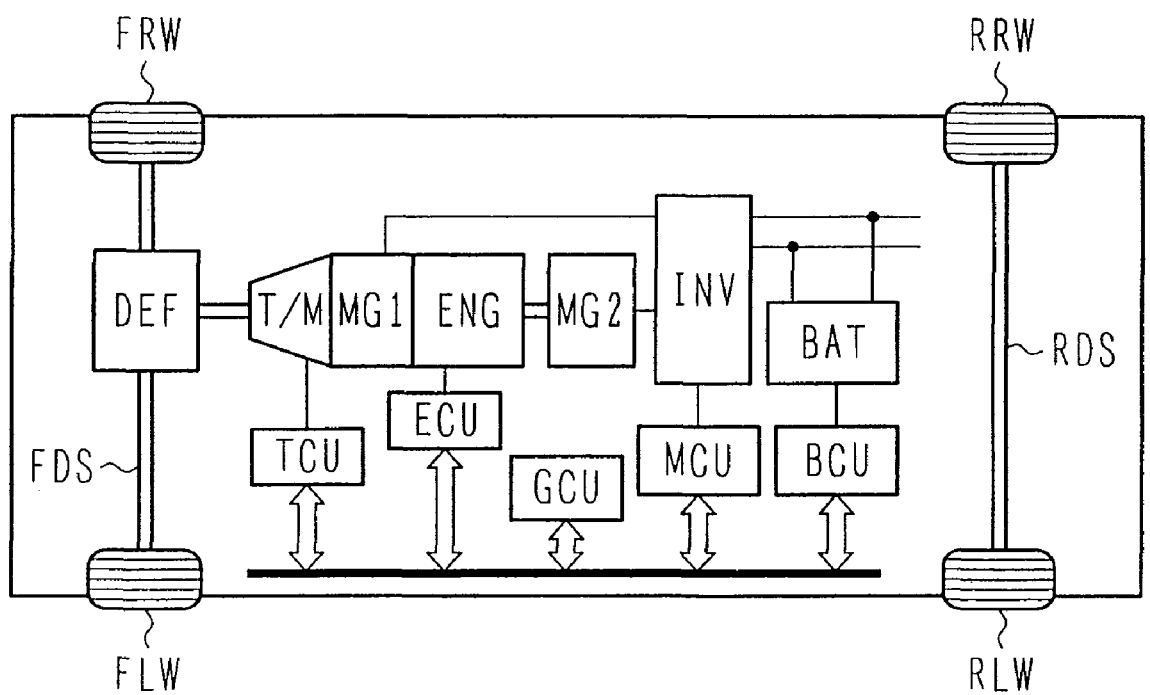
FIG. 1 is a system block diagram that shows a configuration of a vehicle having a vehicular electric machine system according to a first embodiment of the present invention.

FIG. 1 is a system block diagram showing the vehicle configuration including the vehicular electric machine system according to the present embodiment.

The vehicle shown is a hybrid electric vehicle (HEV) that is one form of electric vehicle. The HEV has two power systems. A first power system is an engine system that uses an internal-combustion engine ENG to generate engine power. The engine system is mainly used as a driving source for the HEV. A second power system is an electric machine system powered from a first motor generator MG1. The electric machine system is used primarily as an assist power source for the engine ENG, and as an electric power source for the HEV.

A front-wheel driving shaft FDS is axially supported at a front section of the vehicle body so as to be rotatable. A front left wheel FLW and a front right wheel FRW are provided as one pair of front wheels across the front-wheel driving shaft FDS. In addition, at a rear section of the vehicle body, a rear left wheel RLW and a rear right wheel RRW are axially supported as one pair of rear wheels so as to be made rotatable by a rear-wheel driving shaft RDS.

The HEV in the present embodiment employs a front-wheel driving scheme. Accordingly, the front-wheel driving shaft FDS has a differential gear DEF in a middle section thereof. An output end of the differential gear DEF is mechanically connected to an input end of the front-wheel driving shaft FDS. An output end of a transmission machine T/M is mechanically connected to an input end of the differential gear DEF. The differential gear DEF is an engine power distributor which, after receiving rotational driving force from the transmission machine T/M, distributes the driving force to the front wheels through the front-wheel driving shaft FDS. The transmission machine T/M is an engine power transmission that changes a gear ratio before transmitting the rotational driving force to the differential gear DEF. The rotational driving force is transmitted from the engine ENG and the first motor generator MG1 to the differential gear DEF. A second motor generator MG2 is driven by the engine ENG and mainly used as an electric power generator.

The motor generator MG1 operates exclusively as a motor by receiving generated electric power from the motor generator MG2 or output electric power from a battery BAT via the inverter INV, and generates the rotational driving force needed to drive the vehicle. In addition, the motor generator MG1 operates as an electric power generator by receiving the rotational force transmitted from the front-wheel driving shaft FDS, and supplies self-generated electric power to the battery BAT via the inverter INV. The motor generator MG2 operates exclusively as an electric power generator by receiving the rotational driving force generated by the engine ENG, and supplies self-generated electric power to the battery BAT or the motor generator MG1 via the inverter INV. The motor generators MG1, MG2 in the present embodiment are three-phase AC synchronous, that is to say, permanent-magnet rotating electric machines each with a plurality of permanent magnets embedded in a rotor core or with a plurality of permanent magnets disposed on an outer surface of the rotor core. The motor generators MG1, MG2 can be rotating electric machines of a three-phase AC induction type, a reluctance type, or the like.

The engine ENG has a plurality of devices as its components not shown. These devices include an injector, a throttle valve, an igniter, suction and exhaust valves, and more. The injector is a fuel injection valve for controlling a supply rate of a fuel injected into a cylinder of the engine ENG. The throttle valve controls a supply rate of air which is supplied to the cylinder of the engine ENG. The igniter is a firing source that supplies a spark for firing an air-fuel mixture in the cylinder of the engine ENG. The suction and exhaust valves are open/close valves provided at air suction and exhaust sides of the cylinder within the engine ENG, and open/close timing of each suction/exhaust valve is controlled according to a particular operating cycle of the engine ENG.

The devices described above are controlled by an engine control unit ECU. In accordance with output command signals (command data) from a host controller, output signals (parameters) from sensors and other controllers, and previously stored data and maps within a storage device, the engine control unit ECU computes control signals (control data) to operate each of the above devices. The ECU-computed control signals (control values) are output to device drivers. This controls the operation of each device and hence, that of the engine ENG.

The transmission machine T/M has a transmission (gearshift) mechanism. The transmission mechanism including a plurality of gears provides a plurality of gear ratios by changing, according to the particular operating state of the vehicle, a transmission route of the gear power transmitted as rotational driving force from an input shaft to an output shaft. The transmission mechanism is controlled by a transmission control unit TCU. In accordance with the command signals (command data) output from the host controller, the signals (parameters) output from the sensors and other controllers, and the data and maps previously stored within the storage device, the transmission control unit TCU computes control signals (control data) to operate the transmission mechanism. The TCU-computed control signals (control values) are output to a transmission mechanism driver. This controls the operation of the transmission mechanism and hence, that of the transmission machine T/M.

The motor generators MG1, MG2 have their operation controlled by the inverter INV. Three-phase AC power that has been controlled by the inverter INV is supplied to stator coils of a stator. Thus, the stator can generate rotating magnetic fields. The three-phase AC power supplied to the stator coils has been controlled by the inverter INV, and magnetomotive force of the stator, created by a current supplied to the stator coils, has a resultant vector oriented in a rotational direction of a rotor rather than towards central positions of auxiliary magnetic pole pieces of the rotor. When rotating magnetic fields occur in the stator, a torque by magnetic fluxes of the permanent magnets and a reluctance torque by magnetic fluxes which pass through the auxiliary magnetic pole pieces occur in the rotor, so that the appropriate rotational driving force according to the three-phase AC power occurs in the rotor. That is to say, the motor generators MG1, MG2 can operate as motors.

The inverter INV is a power converter that converts into three-phase AC power the DC power that has been supplied from a high-voltage battery BAT, and has a power module PMU, a drive circuit unit DCU, and a motor control unit MCU.

The power module PMU constitutes a main conversion circuit of the inverter INV and has a plurality of power semiconductor elements. The motor control unit MCU constitutes a controller of the inverter INV. In accordance with the command signals (command data) output from the host controller, the signals (parameters) output from the sensors and other controllers, and the data and maps previously stored within the storage device, the motor control unit MCU computes control signals (control data) to execute power semiconductor element on/off switching. The MCU-computed control signals (control values) are output to the drive circuit unit DCU. The drive circuit unit DCU constitutes a driver of the inverter INV, and in accordance with the control signals (control data) output from the motor control unit MCU, the drive circuit unit DCU generates driving signals to execute power semiconductor element switching. The DCU-generated driving signals are output to the power module PMU.

The high-voltage battery BAT (high-voltage system power supply) is electrically connected to an input (DC) side of the inverter INV. This connection allows the high-voltage battery BAT and the inverter INV to exchange DC power with each other. The DC power stored within the high-voltage battery BAT is supplied to the inverter INV, in which the power is then converted into three-phase AC power.

The high-voltage battery BAT has its charging/discharging controlled by a battery control unit BCU, and a life and other factors of the battery are managed by the BCU. A voltage value of the high-voltage battery BAT, a current value, and other values are input to the battery control unit BCU for charging/discharging control and life management of each battery.

The engine control unit ECU, the transmission machine control unit TCU, the motor control unit MCU, and the battery control unit BCU are electrically connected to one another via a local area network LAN for the vehicle. The four control units are also electrically connected to a general control unit GCU. Thus, bi-directional signal transmission between the control units becomes possible, and this, in turn, allows mutual information transmission and sensor data sharing between the control units. The general control unit GCU outputs command signals to each control unit according to the particular operating state of the vehicle. For example, the general control unit GCU calculates the torque value required of the vehicle according to an accelerator-pedaling stroke based on an accelerating request of a person who drives the vehicle, and distributes the thus-calculated torque requirement into an output torque value of the engine ENG and an output torque value of the first motor generator MG1 so that the engine ENG improves in running efficiency. After the distribution, the output torque value of the engine ENG is output as an engine torque command signal to the engine control unit ECU, and the output torque value of the first motor generator MG1 is output as a motor torque command signal to the motor control unit MCU.

When a vehicle-starting signal (e.g., a signal indicating a release of a foot brake) is input from the vehicle driver, the general control unit GCU outputs an engine speed command signal "n*" as an engine speed command value to the motor control unit MCU. The inverter INV then conducts the DC-AC conversion described below.

In accordance with the engine speed command signal "n*" output as an engine speed command value from the motor control unit MCU, the motor control unit MCU computes a control signal (control value) to operate the power semiconductor elements of the power module PMU. The computed control signal (control value) is output to the drive circuit unit DCU. In order to operate the power semiconductor elements of the power module PMU, the drive circuit unit DCU generates a driving signal based on the computed control signal (control value). The generated driving signal is output to the power module PMU. In accordance with the driving signal that has been output from the drive circuit unit DCU, the power semiconductor elements of the power module PMU are on/off switched, whereby the DC power that has been supplied from the high-voltage battery BAT is then converted into three-phase AC power.

The three-phase AC power that has thus been obtained by the above conversion in the inverter INV is output to the stators of the motor generators MG1, MG2. Thus, the motor generators MG1, MG2 operate as motors to generate the rotational driving force commensurate with the three-phase AC power that has been output from the power module PMU.

The torque command signal (torque command value) output from the general control unit GCU to the engine control unit ECU is equivalent to the appropriate engine speed for the torque requirement "τd". The engine control unit ECU uses the output torque command signal (torque command value) from the general control unit GCU in order to compute control signals (control values) for controlling the component devices of the engine ENG. The computed control signals (control values) are output to the engine component device drivers. This controls the operation of the engine component devices and hence, an air-fuel ratio and other factors of the mixture in the engine ENG. Accordingly, the engine ENG outputs the rotational driving force appropriate for the torque requirement "τd".

The hybrid electric vehicle shown in FIG. 1 has a plurality of operation modes, and driving of an electric power train is appropriately controlled in each of the operation modes. First during a start of the vehicle or during low-speed traveling thereof, mostly the motor generator MG1 operates as a motor, and the rotational driving force that the motor generator MG1 has generated is transmitted to the front-wheel driving shaft FDS via the differential gear DEF. Thus, the driving shaft FDS is rotationally driven by the rotational driving force of the motor generator MG1, and the front left wheel FLW and the front right wheel FRW are rotationally driven to cause the vehicle to travel. At this time, output power (DC power) from the battery BAT is converted into three-phase AC power by the inverter INV and supplied to the motor generator MG1.

Next during normal (middle- or high-speed) traveling of the vehicle, the engine ENG and the motor generator MG1 are used in conjunction and the rotational driving force that the engine ENG has generated, and the rotational driving force that the motor generator MG1 has generated are transmitted to the front-wheel driving shaft FDS via the differential gear DEF. Thus, the driving shaft FDS is rotationally driven by the driving torques of the engine ENG and the motor generator MG1, and the front left wheel FLW and the front right wheel FRW are rotationally driven to cause the vehicle to travel. Also, part of the rotational driving force generated by the engine ENG is supplied to the motor generator MG2. This distribution of the engine power rotationally drives the motor generator MG2 and operates the MG2 as an electric power generator. Three-phase AC power that the motor generator MG2 has generated is supplied to the inverter INV, and after the three-phase AC power has been temporarily rectified into DC power, the DC power is re-converted into three-phase AC power, which is then supplied to the motor generator MG1. Thus, the motor generator MG1 generates rotational driving force.

Next during acceleration of the vehicle, particularly during sudden acceleration that involves full opening of the throttle valve which controls the amount of air supplied to the engine ENG (i.e., when the vehicle driver strongly steps on an accelerator pedal to drive up a steep upgrade), the following is conducted in addition to the above-described normal traveling operation: output power from the battery BAT is converted into three-phase AC power by the inverter INV, the three-phase AC power is supplied to the motor generator MG1, and the rotational driving force that the motor generator MG1 develops is increased.

During vehicle deceleration/braking, rotational driving force of the front-wheel driving shaft FDS by rotational movements of the front wheels FLW, FRW is supplied to the motor generator MG1 via the differential gear DEF and a reduction gear RG. The rotational driving force activates the motor generator MG1 as an electric power generator to generate electric power. Three-phase AC power (regenerative energy) that has thus been obtained is rectified into DC power by the inverter INV and then supplied to the battery BAT. The battery BAT is thus recharged. During a stop of the vehicle, the driving of the engine ENG and that of the motor generators MG1, MG2 are basically stopped, but when the amount of electrical energy left in the battery BAT is small, the engine ENG is driven to operate the motor generator MG2 as an electric power generator. Electric power that has thus been obtained is supplied to the battery BAT via the inverter INV.

Next, circuit composition of the inverter INV in the vehicular electric machine system of the present embodiment is described below by using FIG. 2.

Figure 2:
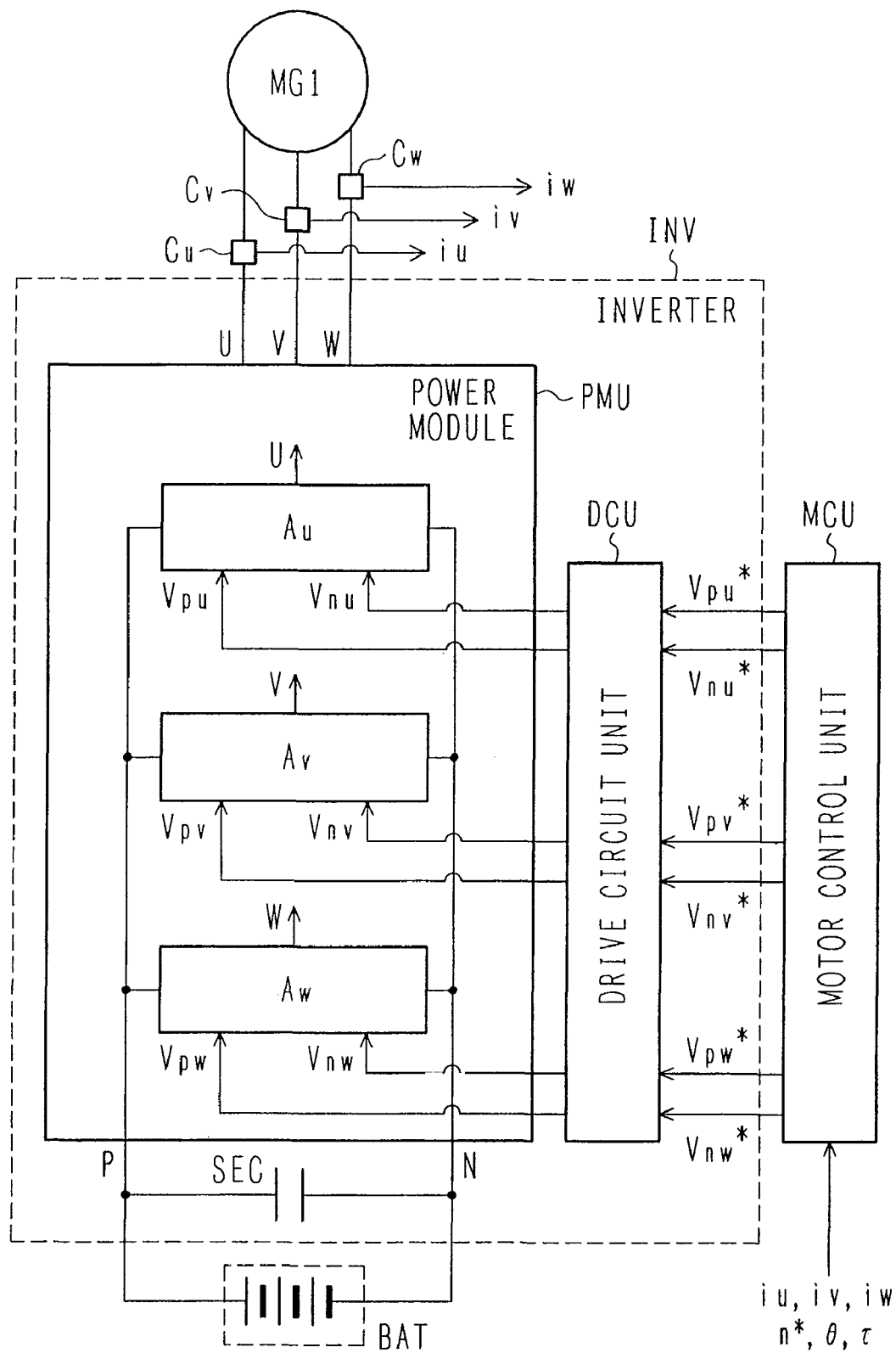
FIG. 2 is a block diagram that shows circuit composition of an inverter INV used in the vehicular electric machine system according to the first embodiment of the invention.

FIG. 2 is a block diagram showing the circuit composition of the inverter INV in the vehicular electric machine system of the first embodiment of the present invention. The same reference numbers and symbols as used in FIG. 1 denote the same elements.

The inverter INV in the present embodiment includes the power module PMU and the drive circuit unit DCU. Although only the circuit composition of the inverter INV for the first motor generator MG1 is shown in FIG. 2, the inverter INV also has a power module and drive circuit unit for the second motor generator MG2 and is of the same circuit composition as that shown in FIG. 2.

The power module PMU constitutes a main circuit for electric power conversion. The power module PMU operates under a driving signal output from the drive circuit unit DCU, converts into three-phase AC power the DC power that has been supplied from the high-voltage battery BAT, and supplies the three-phase AC power to the stator coils of the motor generator MG1. The main circuit of the power module PMU is a three-phase bridge circuit, in which three-phase series circuits of power semiconductor elements (U-phase arm "Au", V-phase arm "Av", and W-phase arm "Aw") are electrically connected in parallel between a positive terminal P and negative terminal N of the high-voltage battery BAT. Each of the series circuits is also called an arm, which is constructed of two power semiconductor elements.

Each arm is constructed by electrically connecting the power semiconductor element of an upper arm and that of a lower arm in series. The present embodiment uses insulated-gate bipolar transistors (IGBTs) as the power semiconductor elements. The IGBTs each need to have an independent diode element electrically connected between a collector electrode and an emitter electrode. Each IGBT includes a gate electrode in addition to the collector electrode and the emitter electrode.

Each power semiconductor element can be an n-channel MOSFET (Metal-Oxide Semiconductor Field-Effect Transistor) that is a switching semiconductor element. The semiconductor chip constituting the MOSFET has a drain electrode, a source electrode, and a gate electrode. Also, a parasitic diode in which a forward direction of a current is from the source electrode to the drain electrode is electrically connected between the source and drain electrodes.

The U-phase arm "Au" is constructed by electrically connecting in series the emitter electrode of the upper-arm power semiconductor element and the collector electrode of the lower-arm power semiconductor element. The V-phase arm "Av" and the W-phase arm "Aw" also have the same construction as that of the U-phase arm "Au". That is to say, the emitter electrode of the upper-arm power semiconductor element and the collector electrode of the lower-arm power semiconductor element are electrically connected in series to form the V-phase arm "Av" or the W-phase arm "Aw".

The collector electrode of the upper-arm power semiconductor element is electrically connected to a high-potential (positive) side of the high-voltage battery BAT. The emitter electrode of the lower-arm power semiconductor element is electrically connected to a low-potential (negative) side of the high-voltage battery BAT. A neutral point of the U-phase arm "Au" (i.e., a connection portion between the emitter electrode of the upper-arm power semiconductor element and the collector electrode of the lower-arm power semiconductor element) is electrically connected to a U-phase stator coil of the motor generator MG1. As a neutral point of the U-phase arm "Au", the neutral points of the V-phase arm "Av" and the W-phase arm "Aw" are electrically connected at respective neutral points to V-phase and W-phase stator coils of the motor generator MG1.

Between the positive side and negative side of the high-voltage battery BAT, a smoothing electrolytic capacitor SEC is electrically connected to suppress changes in DC voltage due to the operation of the power semiconductor elements.

The power module PMU is constructed with semiconductor chips mounted on a casing-surrounded base via dielectric substrates. In order to form a three-phase bridge circuit, the power module PMU also includes connection conductors, such as aluminum wires or plate-like conductors, that are electrically connected between the semiconductor chips, between the semiconductor chips and input terminals, and between the semiconductor chips and output terminals. The base is constructed of a thermally conductive member such as copper or aluminum. The base is also constructed so that a lower face thereof is cooled by a cooling medium such as air or cooling water. The lower face of the base has fins and others to improve cooling efficiency based on the cooling medium. The dielectric substrates are formed of an electrical insulating member such as aluminum nitride. The semiconductor chips constitute the IGBTs described above, and each have an electrode on both sides. The dielectric substrates are bonded onto the base and the semiconductor chips via bonding members such as solder.

The drive circuit unit DCU is electrically connected to the gate electrodes of the upper-arm and lower-arm power semiconductor elements of the U-phase, V-phase, and W-phase arms. Control signals Vpu* (Vpv*, Vpw*) for the upper-arm power semiconductor elements are output from the motor control unit MCU to the drive circuit unit DCU, and the control signals Vpu* (Vpv*, Vpw*) that have been received by the DCU are next output to the gate electrodes of the upper-arm power semiconductor elements as driving signals Vpu (Vpv, Vpw) to drive the upper-arm power semiconductor elements.

Control signals Vnu* (Vnv*, Vnw*) for the lower-arm power semiconductor elements are also output from the motor control unit MCU to the drive circuit unit DCU, and the control signals Vnu* (Vnv*, Vnw*) that have been received by the DCU are next output to the gate electrodes of the lower-arm power semiconductor elements as driving signals Vnu (Vnv, Vnw) to drive the lower-arm power semiconductor elements.

On the basis of a plurality of input signals, the motor control unit MCU computes the control values for operating the power semiconductor elements of the power module PMU, and outputs the computed control values as the above control signals Vpu*–Vnw* drive circuit unit DCU. Therefore, the motor control unit MCU has a microcomputer to compute the control values.

A torque command signal (torque command value) "τ*", an engine speed command signal (engine speed command value) "n*", sensor signals (U-phase, V-phase, and W-phase current values) "iu", "iv", "iw", and a further sensor signal (rotor magnetic pole piece position) "θ" are supplied as input signals to the microcomputer.

The torque command signal (torque command value) "τ*" and the engine speed command signal (engine speed command value) "n*" are output from the general control unit GCU according to a particular operation mode of the vehicle. The sensor signals (U-phase, V-phase, and W-phase current values) "iu", "iv", "iw" are output from current sensors Cu, Cv, Cw. The sensor signal (rotor magnetic pole piece position) "θ" is output from a magnetic pole piece position sensor.

The current sensors Cu, Cv, Cw, for sensing the U-phase, V-phase, and W-phase current values "iu", "iv", "iw" supplied from the inverter INV (power module PMU) to the stator coils of the stators within the motor generators MG1, MG2, each include elements such as a shunt resistor and a current transformer (CT).

The magnetic pole piece position sensor for detecting a magnetic pole piece position "θ" of the rotor in the motor generator MG1, MG2 includes elements such as a resolver, an encoder, a Hall element, and a Hall IC.

The microcomputer computes d-axis and q-axis current command values "Id*" and "Iq*" from the input signals and then computes voltage control values Vu, Vv, Vw from the computed current command values "Id*", "Iq*". Also, the microcomputer outputs to the drive circuit unit DCU the computed voltage control values Vu, Vv, Vw as the control signals Vpu*–Vnw* for operating the power semiconductor elements of the power module PMU. The control signals Vpu*–Vnw* are pulse width modulation (PWM) signals.

Next, circuit composition of the power module PMU used in the vehicular electric machine system of the present embodiment is described below by using FIGS. 3 and 4.

Figure 3:
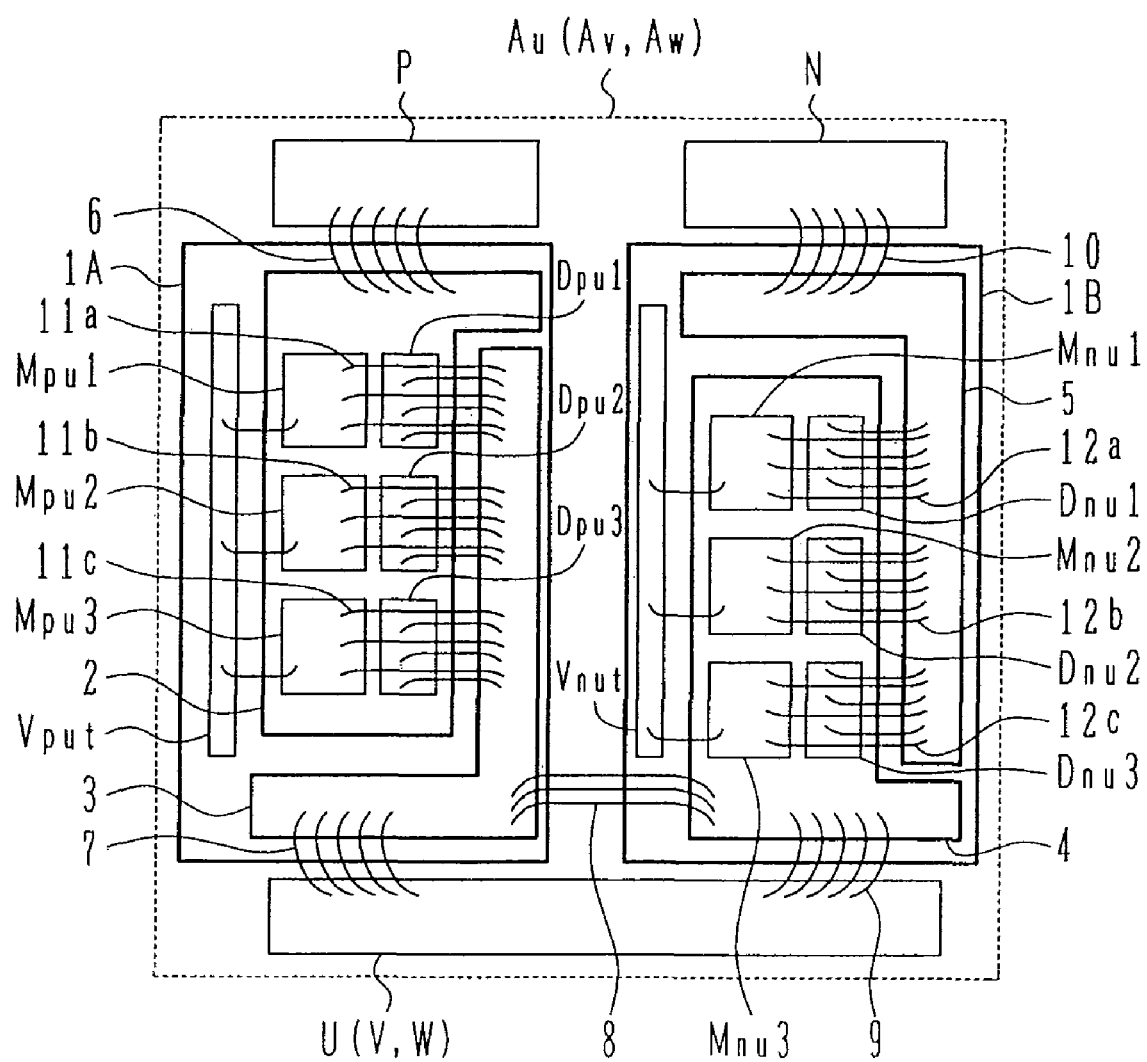
FIG. 3 is a plan view showing a configuration of a U-phase (V-phase, W-phase) arm "Au" ("Av", "Aw") of a power module PMU used in the vehicular electric machine system according to the first embodiment of the invention.
Figure 4:
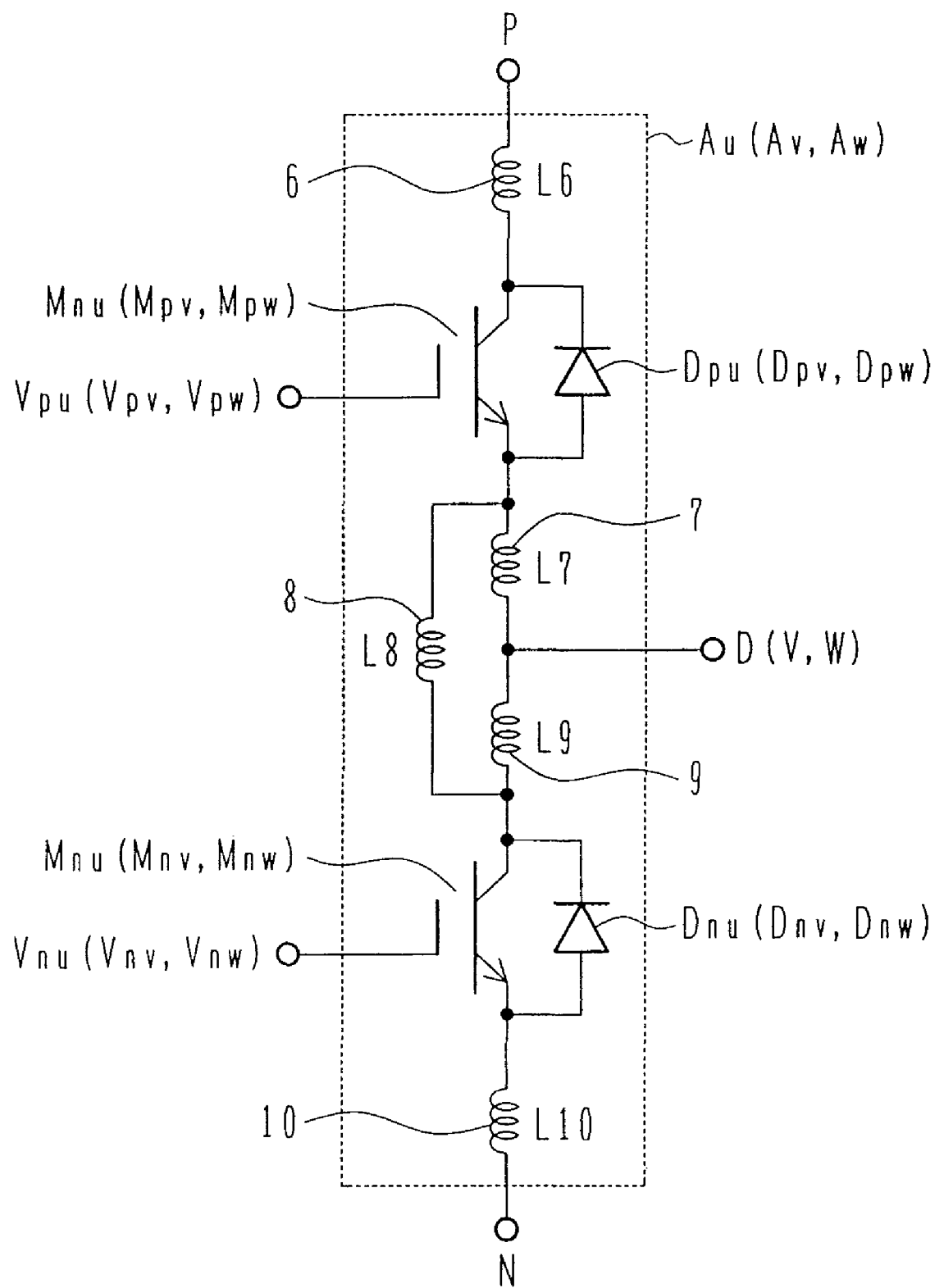
FIG. 4 is an equivalent circuit diagram of the U-phase (V-phase, W-phase) arm "Au" ("Av", "Aw") shown in FIG. 3.

FIG. 3 is a plan view showing a configuration of the U-phase (V-phase, W-phase) arm "Au" ("Av", "Aw") of the power module PMU used in the vehicular electric machine system of the present embodiment. FIG. 4 is an equivalent circuit diagram of the U-phase (V-phase, W-phase) arm "Au" ("Av", "Aw") shown in FIG. 3. The same reference numbers and symbols as used in FIGS. 1, 2 denote the same elements.

The dielectric substrates 1A, 1B are formed of an electrical insulating member such as aluminum nitride. A positive collector conductor 2, a positive emitter conductor 3, and a positive control terminal conductor Vput are solder-bonded onto the dielectric substrate 1A. A negative collector conductor 4, a negative emitter conductor 5, and a negative control terminal conductor Vnut are solder-bonded onto the dielectric substrate 1B.

Three positive IGBTs (Mpu1, Mpu2, Mpu3) are mounted in the positive collector conductor 2, and collector electrodes (current suction sections) of each of the IGBTs are electrically solder-bonded onto the positive collector conductor 2. Three positive diodes (Dpu1, Dpu2, Dpu3) are also mounted in the positive collector conductor 2, and cathodic electrodes (current discharge sections) of each of the diodes are electrically solder-bonded onto the positive collector conductor 2.

A positive input terminal P is electrically connected to the positive collector conductor 2 via a plurality of aluminum wires 6. Emitter electrodes of the three positive IGBTs (Mpu1, Mpu2, Mpu3) and anodic electrodes of the three positive diodes (Dpu1, Dpu2, Dpu3) are each electrically bonded onto the positive emitter conductor 3 via, for example, a plurality of aluminum wires 11a, 11b, and 11c, respectively. In addition, gate electrodes (control electrodes) of the three positive IGBTs (Mpu1, Mpu2, Mpu3) are each electrically connected to the positive control terminal conductor Vput via an aluminum wire.

The positive emitter conductor 3 and the negative collector conductor 4 are electrically connected to an output terminal U (V, W) via a plurality of aluminum wires 7 and 9, respectively. In addition, in the present embodiment, the positive emitter conductor 3 is electrically connected to the negative collector conductor 4 via a plurality of aluminum wires 8. In FIG. 3, when a current flows from the emitter electrodes of the positive IGBTs into the collector electrodes of the negative IGBTs, two paths are formed to permit the current to flow through the aluminum wires 7 and 9 and to flow through the aluminum wires 8. The aluminum wires 8 forming the latter path are short, so the latter path is small in inductance compared with the former path.

Three negative IGBTs (Mnu1, Mnu2, Mnu3) are mounted in the negative collector conductor 4, and collector electrodes (current suction sections) of each of the IGBTs are electrically solder-bonded onto the negative collector conductor 4. Three negative diodes (Dnu1, Dnu2, Dnu3) are also mounted in the negative collector conductor 4, and cathodic electrodes (current discharge sections) of each of the diodes are electrically solder-bonded onto the negative collector conductor 4.

A negative input terminal N is electrically connected to the negative emitter conductor 5 via a plurality of aluminum wires 10. Emitter electrodes of the three negative IGBTs (Mnu1, Mnu2, Mnu3) and anodic electrodes of the three negative diodes (Dnu1, Dnu2, Dnu3) are each electrically bonded onto the negative emitter conductor 5 via a plurality of aluminum wires 12a, 12b, and 12c, respectively. In addition, gate electrodes (control electrodes) of the three negative IGBTs (Mnu1, Mnu2, Mnu3) are each electrically connected to the negative control terminal conductor Vnut via an aluminum wire.

While IGBTs are used as the power semiconductor elements in the example shown in FIG. 3, MOSFETs may be used instead and if the MOSFETs are actually used, the diodes shown in the figures are unnecessary. In addition, while the IGBTs and the diodes are connected in parallel in sets of three, these quantities of IGBTs and diodes depend on a capacity of the electric power converter and are likely to be one each.

Furthermore, while the configuration of the U-phase arm "Au" is shown in FIG. 3, the V-phase arm and the W-phase arm are also of the same configuration.

The positive terminal of the high-voltage battery BAT is connected to the positive input terminal P via a conductor, and the negative terminal of the high-voltage battery BAT is connected to the negative input terminal N via a conductor. A DC voltage is applied between the positive input terminal P and the negative input terminal N.

The output terminal U has a connected U-phase stator coil of the motor generator MG1, and a current flows through the stator coil when the positive IGBTs and the negative IGBTs are turned on and off, respectively.

Electrical operation of the U-phase of the power module in the present embodiment is described in detail below by using FIG. 4.

The positive input terminal P is connected to the collector electrode of the positive IGBT (Mpu, Mpv, Mpw) via the aluminum wires 6. The emitter electrode of the positive IGBT (Mpu, Mpv, Mpw) is connected to the output terminal U (V, W) via the aluminum wires 7. This emitter electrode is further connected to the collector electrode of the negative IGBT (Mnu, Mnv, Mnw) via the aluminum wires 8.

The output terminal U (V, W) is also connected to the collector electrode of the negative IGBT (Mnu, Mnv, Mnw) via the aluminum wires 9. The emitter electrode of the negative IGBT (Mnu, Mnv, Mnw) is connected to the negative input terminal N via the aluminum wires 10.

The cathodic electrode of the positive diode (Dpu, Dpv, Dpw) is connected to the collector electrode of the positive IGBT (Mpu, Mpv, Mpw), and the anodic electrode of the positive diode (Dpu, Dpv, Dpw) is connected to the emitter electrode of the positive IGBT (Mpu, Mpv, Mpw). The cathodic electrode of the negative diode (Dnu, Dnv, Dnw) is connected to the collector electrode of the negative IGBT (Mnu, Mnv, Mnw), and the anodic electrode of the negative diode (Dnu, Dnv, Dnw) is connected to the emitter electrode of the negative IGBT (Mnu, Mnv, Mnw).

While the aluminum wires 6, 7, 8, 9, 10 are electrically expressed as series-connected inductive components and resistive components, the resistive components are omitted from FIG. 3 since the components are unnecessary in the description of electrical operation. Only inductances are therefore expressed as L6, L7, L8, L9, L10. In addition, while the IGBTs and the diodes are connected in parallel in groups of three in FIG. 1, the quantities of these circuit elements are shown as one each, for simplicity in the illustration per FIG. 4.

First, how the circuit operates without the inductance L8 is explained below for descriptive simplicity.

The explanation below assumes that Vpu is the gate electrode of the positive IGBT (Mpu), Vnu is the gate electrode of the negative IGBT (Mun), and a load inductance L connected between the output terminal U and the negative input terminal N as a stator coil of the motor generator MGI are provided. The positive IGBT is turned on when a voltage equal to or greater than a threshold voltage level of the IGBT is applied between the gate electrode Vpu and emitter electrode thereof. At the same time, a voltage lower than a threshold voltage value of the negative IGBT is applied between the gate electrode Vnu and emitter electrode thereof, thus turning off the IGBT. Therefore, there is a first current path along which the current flows through the positive input terminal P, the inductance L6, the positive IGBT, the inductance L7, the output terminal U, the load inductance L, and the negative input terminal N, in that order.

Next when the positive IGBT is turned off and the negative IGBT is also turned off, the current path changes to a second path along which the current flows through the load inductance L, the negative input terminal N, the inductance L10, the negative diode (Dnu), the inductance L9, and the output terminal U, in that order. The current under this state continues to flow until the energy stored within the load inductance L has disappeared.

The moment the positive IGBT is turned back on with the current flowing along the second path, a time-varying change of "di/dt" in current value occurs on a third current path along which the current flows through the positive input terminal P, the inductance L6, the positive IGBT, the inductance L7, the inductance L9, the negative diode, the inductance L10, and the negative input terminal N, in that order. Total inductance Ls1 in the third path amounts to L6+L7+L9+L10. At this time, therefore, an electromotive voltage of (Ls1·di/dt) occurs between the collector and emitter electrodes of the negative IGBT. This voltage is called a surge voltage. The total inductance Ls1 must be reduced to prevent the surge voltage from exceeding a withstand voltage of the IGBT.

Accordingly, in the present embodiment, the positive emitter conductor 3 and the negative collector conductor 4 are electrically interconnected by using the plurality of aluminum wires 8, as described in FIG. 3. That is to say, in FIG. 4, the inductance L8 is connected in parallel to the series circuit of the inductances L7 and L9. The operation conducted with the inductance L8 connected in parallel is described below.

The positive IGBT is turned on when a voltage equal to or greater than the threshold voltage level of the IGBT is applied between the gate electrode Vpu and emitter electrode thereof. At the same time, a voltage lower than the threshold voltage value of the negative IGBT is applied between the gate electrode Vnu and emitter electrode thereof, thus turning off the IGBT. In addition to the above-described first path, therefore, there is a fourth current path along which the current flows through the positive input terminal P, the inductance L6, the positive IGBT, the inductance L8, the inductance L9, the output terminal U, the load inductance L, and the negative input terminal N, in that order.

Next when the positive IGBT is turned off and the negative IGBT is also turned off, the current path changes not only to the second path, but also to a fifth path along which the current flows through the load inductance L, the negative input terminal N, the inductance L10, the negative diode (Dnu), the inductance L8, the inductance L7, and the output terminal U, in that order. The current under this state continues to flow until the energy stored within the load inductance L has disappeared.

The moment the positive IGBT is turned back on with the current flowing along the second path and the fifth path, the time-varying change of "di/dt" in current value occurs on the third path and a sixth current path along which the current flows through the positive input terminal P, the inductance L6, the positive IGBT, the inductance L8, the negative diode, the inductance L10, and the negative input terminal N, in that order. Total inductance Ls2 in the third and sixth paths amounts to [L6+(L7+L9)·L8/(L7+L9+L8)+L10]. Since the inductance L8 and the inductance L7+L9 are connected in parallel, resultant inductance amounts to [(L7+L9)·L8/(L7+L9+L8)]. The inductance values L6, L7, L8, L9, and L10 are positive finite values, so [(L7+L9)·L8/(L7+L9+L8)]<(L7+L9) holds. Hence, Ls2<Ls1 holds and Ls1·di/dt<Ls2·di/dt holds. Parasitic inductance of the U-phase of the power module can therefore be reduced by adding the inductance L8 formed by the plurality of aluminum wires 8.

When the inductance L8 and the inductance L7+L9 are the same, Ls2 of the third and sixth paths decreases to half of the total inductance Ls1 of the third path, and when L8<(L7+L9), Ls2 of the third and sixth paths decreases below half of the total inductance Ls1 of the third path. For example, if the inductance L7, L9 is 5 nH and the inductance L8 is 5 nH, Ls2 of the third and sixth paths amounts to 3.3 nH. In actual operation, laying out the current path of the positive and negative IGBTs into a U-shape as shown in FIG. 3 makes it possible for the inductance to be reduced below half, since the path through the inductance 8 becomes shorter than that of the inductance L7+L9.

The above operational description applies when the load inductance is present between the output terminal U and the negative input terminal N. The operational description also applies when the load inductance is present between the positive input terminal P and the output terminal U. In addition, although the operational description relates to the U-phase arm "Au", the same also applies to the V-phase arm "Av" and the W-phase arm "Aw".

Furthermore, instead of the plurality of aluminum wires 8, a plate-shaped good conductor such as copper can be used to electrically interconnect the positive emitter conductor 3 and the negative collector conductor 4.

As described above, according to the present embodiment, the parasitic inductance of the output terminal section can be reduced, so it is possible to provide a low-loss, highly noise immune, and highly reliable power module capable of reducing the surge voltage occurring during switching.

Also, a cooling device for the inverter INV can be reduced in dimensions and costs since using the low-loss power module makes it possible to reduce the amount of heat generated therefrom.

Additionally, since the dielectric substrates 1A, 1B are formed by using a dielectric substrate split between the positive side and the negative side, this forming method reduces an area per substrate compared with forming both substrates with one sheet, and since thermal distortion of the dielectric substrates can be reduced, the substrates can be made longer-lived. Furthermore, since the dielectric substrates are of the same shape, each substrate can be used for either the positive or negative side. This can reduce the costs.

The arms may be stored into independent modules for each phase (two-in-one moduling) or all arms may be stored into one module (six-in-one moduling).

Next, circuit composition of a power module according to a second embodiment of the present invention is described below by using FIG. 5. A configuration of a vehicle with a vehicular electric machine system according to the present embodiment is essentially the same as the configuration shown in FIG. 1. Also, circuit composition of an inverter INV in the vehicular electric machine system according to the present embodiment is essentially the same as the composition shown in FIG. 2.

Figure 5:
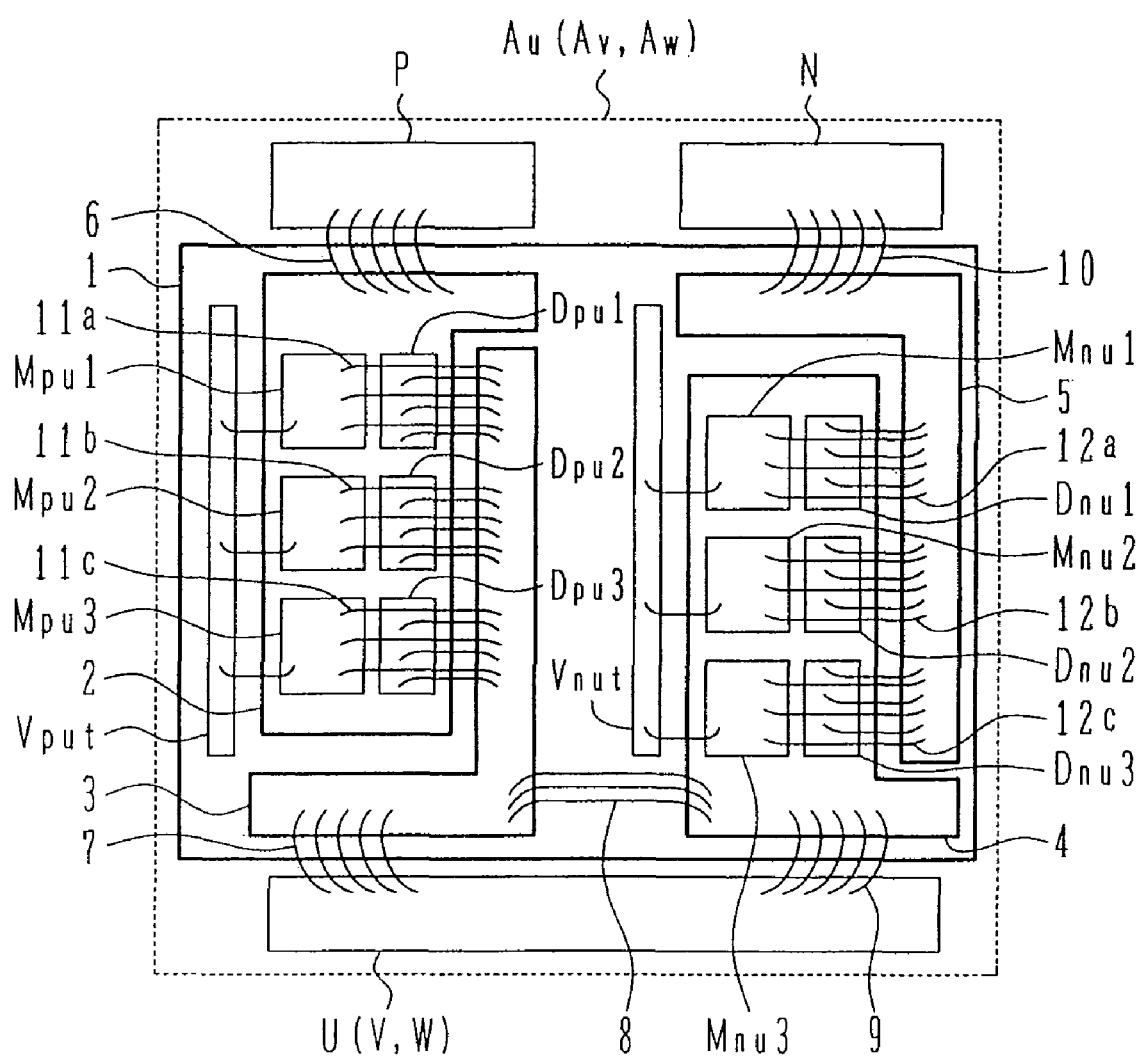
FIG. 5 is a plan view showing a configuration of a U-phase (V-phase, W-phase) arm "Au" ("Av", "Aw") of a power module PMU used in a vehicular electric machine system according to a second embodiment of the invention.

FIG. 5 is a plan view showing a configuration of a U-phase (V-phase, W-phase) arm "Au" ("Av", "Aw") of the power module PMU used in the vehicular electric machine system of the present embodiment. The same reference numbers and symbols as used in FIGS. 1 to 4 denote the same elements.

In the present embodiment, a positive collector conductor 2, a positive emitter conductor 3, a negative collector conductor 4, and a negative emitter conductor 5 are solder-bonded onto a dielectric substrate 1. That is to say, whereas the dielectric substrates 1A, 1B shown in FIG. 3 have been used for the positive side and the negative side respectively, the larger dielectric substrate 1 common to both positive and negative sides is used in the present embodiment.

In the present embodiment, as in FIG. 3, the positive emitter conductor 3 and the negative collector conductor 4 are electrically interconnected via a plurality of aluminum wires 8. This electrical interconnection may use a plate-shaped good conductor such as copper instead of the plurality of aluminum wires 8. Other compositional aspects are essentially the same as those of the embodiment shown in FIG. 3.

In the present embodiment, since parasitic inductance of an output terminal section can also be reduced, it is possible to provide a low-loss, highly noise immune, and highly reliable power module capable of reducing a surge voltage during switching.

In addition, a cooling device for an inverter INV can be reduced in dimensions and costs since using the low-loss power module makes it possible to reduce the amount of heat generated therefrom.

Furthermore, the arms may be stored into independent modules for each phase (two-in-one moduling) or all arms may be stored into one module (six-in-one moduling).

Next, circuit composition of a power module according to a third embodiment of the present invention is described below using FIG. 6. A configuration of a vehicle with a vehicular electric machine system according to the present embodiment is essentially the same as the configuration shown in FIG. 1. Also, circuit composition of an inverter INV in the vehicular electric machine system according to the present embodiment is essentially the same as the composition shown in FIG. 2.

Figure 6:
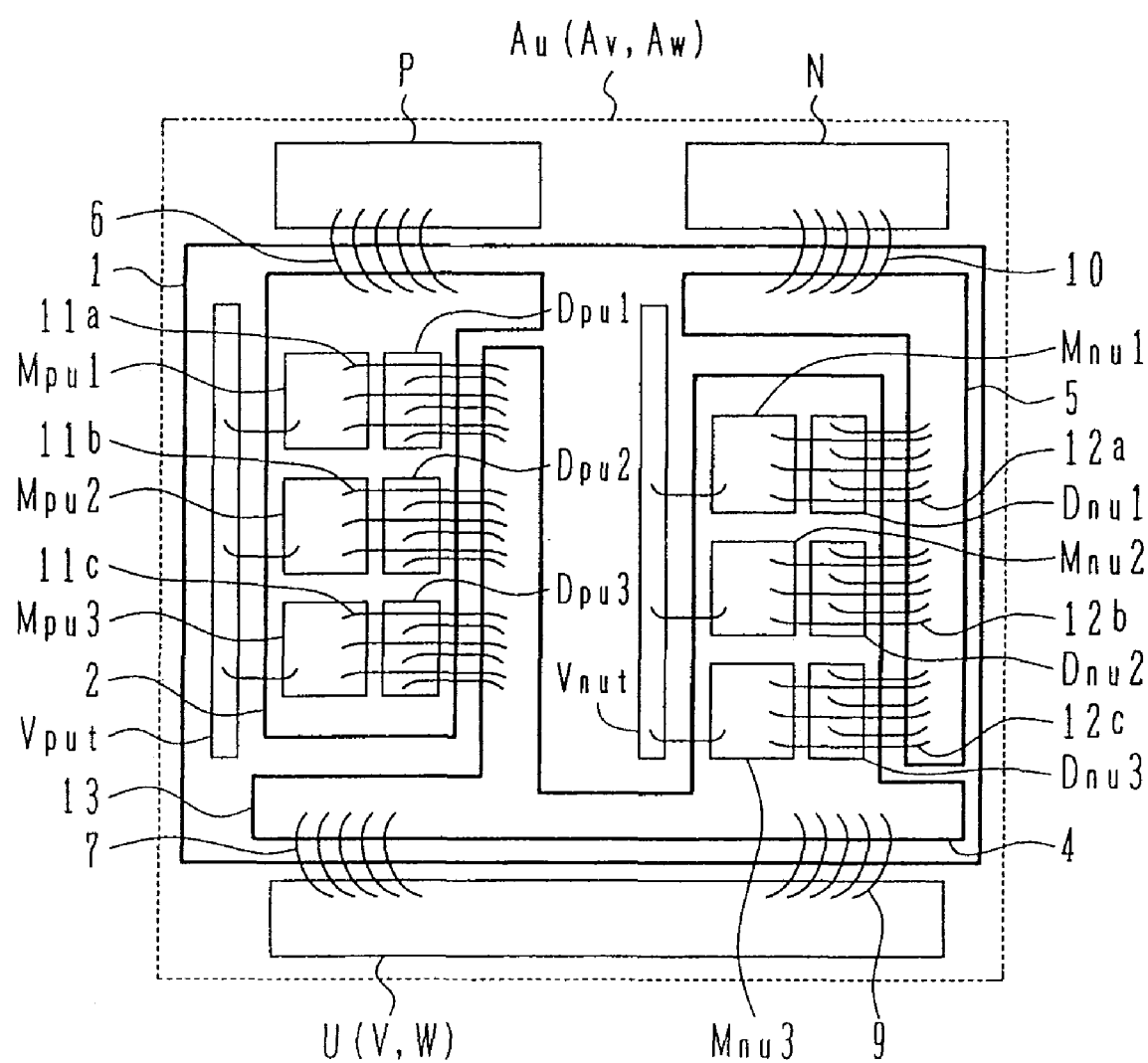
FIG. 6 is a plan view showing a configuration of a U-phase (V-phase, W-phase) arm "Au" ("Av", "Aw") of a power module PMU used in a vehicular electric machine system according to a third embodiment of the invention.

FIG. 6 is a plan view showing a configuration of a U-phase (V-phase, W-phase) arm "Au" ("Av", "Aw") of the power module PMU used in the vehicular electric machine system of the present embodiment. The same reference numbers and symbols as used in FIGS. 1 to 5 denote the same elements.

The present embodiment differs from the embodiment of FIG. 3 in that a positive emitter conductor and a negative collector conductor are integrated into one conductor pattern formed as an emitter-collector conductor pattern 13. In the entire emitter-collector conductor pattern 13, a conductor section that connects a positive emitter conductor and a negative collector conductor has a function equivalent to that of the plurality of aluminum wires 8 shown in FIG. 5. Other compositional aspects are essentially the same as those of the embodiment shown in FIG. 5.

Since the positive emitter conductor and the negative collector conductor are thus formed as the emitter-collector conductor pattern 13 that is one conductor pattern, the step of arranging the plurality of aluminum wires 8 to connect the positive emitter conductor and the negative collector conductor can be deleted from the composition shown in FIG. 5.

As described above, parasitic inductance of an output terminal section can also be reduced in the present embodiment, so it is possible to provide a low-loss, highly noise immune, and highly reliable power module capable of reducing a surge voltage during switching.

In addition, a cooling device for an inverter INV can be reduced in dimensions and costs since using the low-loss power module makes it possible to reduce the amount of heat generated therefrom.

Furthermore, the arms may be stored into independent modules for each phase (two-in-one moduling) or all arms may be stored into one module (six-in-one moduling).

Next, circuit composition of a power module according to a fourth embodiment of the present invention is described below by using FIG. 7. A configuration of a vehicle with a vehicular electric machine system according to the present embodiment is essentially the same as the configuration shown in FIG. 1. Also, circuit composition of an inverter INV in the vehicular electric machine system according to the present embodiment is essentially the same as the composition shown in FIG. 2.

Figure 7:
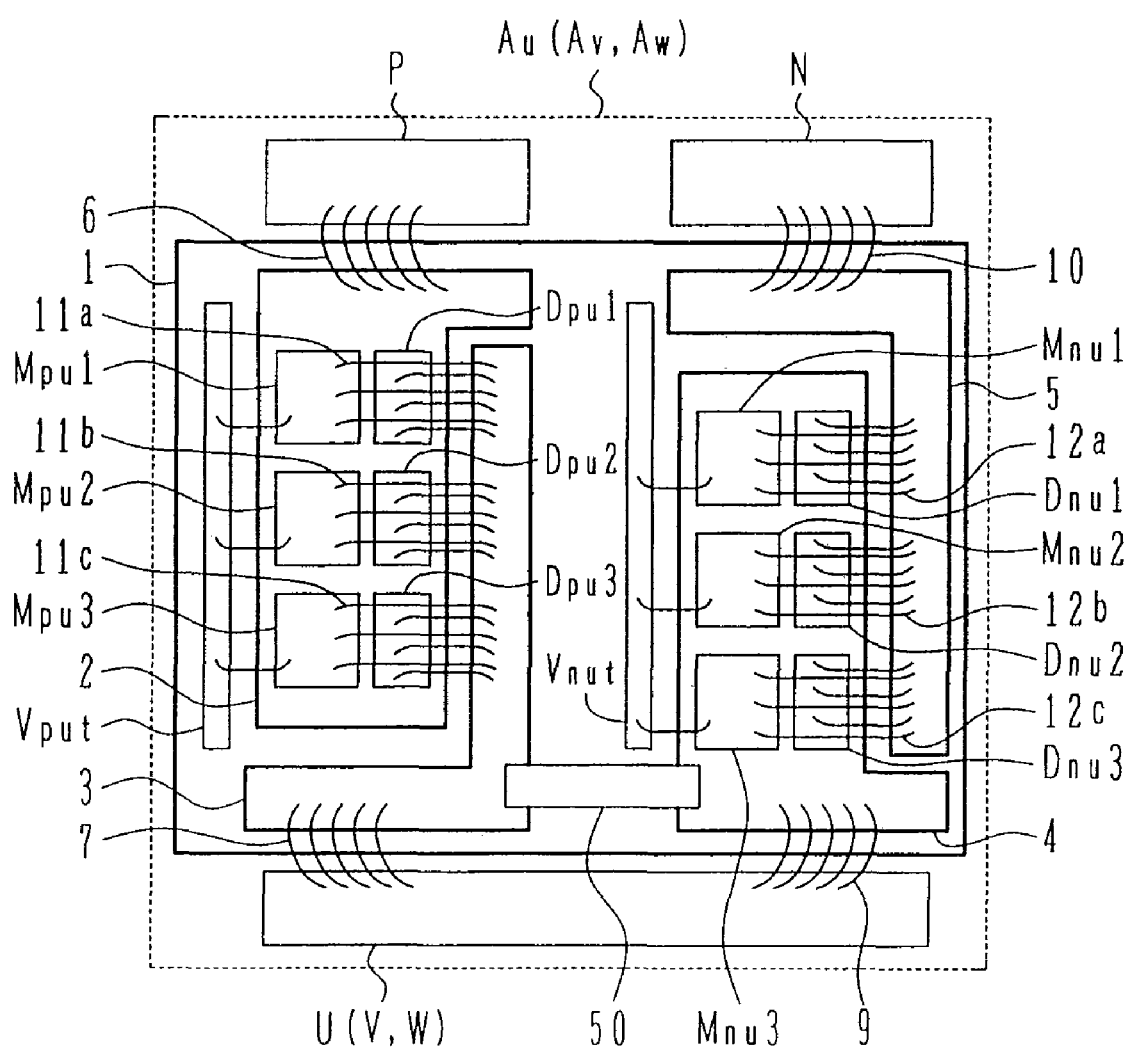
FIG. 7 is a plan view showing a configuration of a U-phase (V-phase, W-phase) arm "Au" ("Av", "Aw") of a power module PMU used in a vehicular electric machine system according to a fourth embodiment of the invention.

FIG. 7 is a plan view showing a configuration of a U-phase (V-phase, W-phase) arm "Au" ("Av", "Aw") of the power module PMU used in the vehicular electric machine system of the present embodiment. The same reference numbers and symbols as used in FIGS. 1 to 5 denote the same elements.

The present embodiment differs from the embodiment of FIG. 5 in that a positive emitter conductor 3 and a negative collector conductor 4 are interconnected by using a plate-shaped conductor 50. Other compositional aspects are essentially the same as those of the embodiment shown in FIG. 5.

The present embodiment, compared with the embodiment shown in FIG. 5, makes it possible to easily increase the plate-shaped conductor in thickness, so resistive components can be reduced in magnitude. In addition, a bonding time can be shortened in comparison with that based on the connection of plural aluminum wires.

As described above, parasitic inductance of an output terminal section can also be reduced in the present embodiment, so it is possible to provide a low-loss, highly noise immune, and highly reliable power module capable of reducing a surge voltage during switching.

In addition, a cooling device for an inverter INV can be reduced in dimensions and costs since using the low-loss power module makes it possible to reduce the amount of heat generated therefrom.

Furthermore, the arms may be stored into independent modules for each phase (two-in-one moduling) or all arms may be stored into one module (six-in-one moduling).

Next, circuit composition of a power module according to a fifth embodiment of the present invention is described below by using FIG. 8. A configuration of a vehicle with a vehicular electric machine system according to the present embodiment is essentially the same as the configuration shown in FIG. 1. Also, circuit composition of an inverter INV in the vehicular electric machine system according to the present embodiment is essentially the same as the composition shown in FIG. 2.

Figure 8:
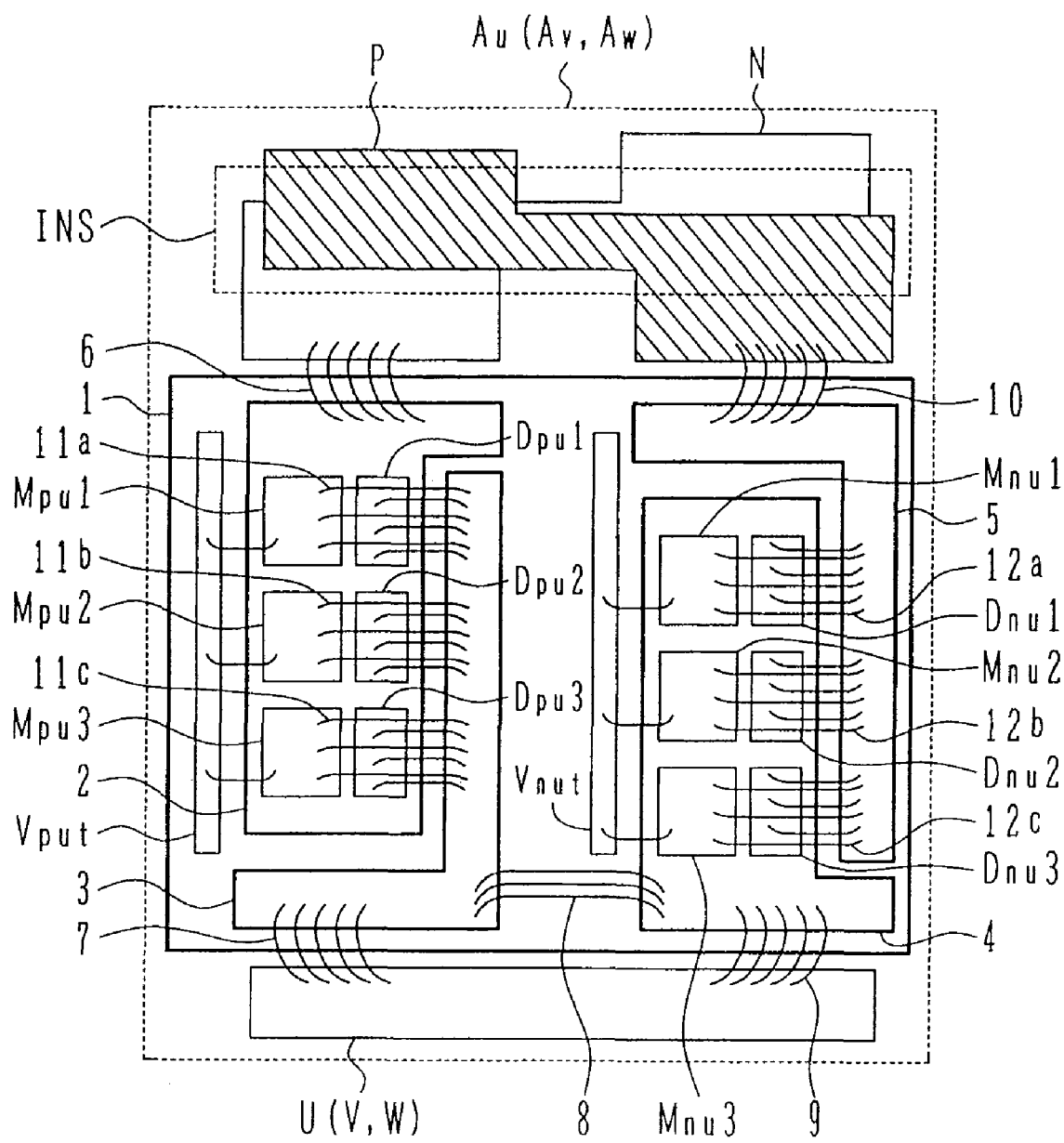
FIG. 8 is a plan view showing a configuration of a U-phase (V-phase, W-phase) arm "Au" ("Av", "Aw") of a power module PMU used in a vehicular electric machine system according to a fifth embodiment of the invention.

FIG. 8 is a plan view showing a configuration of a U-phase (V-phase, W-phase) arm "Au" ("Av", "Aw") of the power module PMU used in the vehicular electric machine system of the present embodiment. The same reference numbers and symbols as used in FIGS. 1 to 5 denote the same elements.

The present embodiment differs from the embodiment of FIG. 5 in shapes of a positive input terminal P and a negative input terminal N. The positive input terminal P and the negative input terminal N are electrically insulated from each other via an insulator INS, and are formed into a stacked structure. Other compositional aspects are essentially the same as those of the embodiment shown in FIG. 5.

Operation of each arm in the present embodiment is much the same as in the embodiment of FIG. 3. A current path through the positive input terminal P and that of the negative input terminal N, however, differ. That is to say, in the present embodiment, since a flow of a current through the positive input terminal P and a flow of a current through the negative input terminal N cross via the insulator, electromagnetic interference between magnetic fluxes generated by the currents allows the positive input terminal P and the negative input terminal N to be reduced in inductance.

Compared with the embodiment shown in FIG. 5, therefore, the present embodiment allows inductance reduction of an input terminal section in addition to inductance reduction of the output terminal section.

As described above, parasitic inductance of the output terminal section can also be reduced in the present embodiment, so it is possible to provide a low-loss, highly noise immune, and highly reliable power module capable of reducing a surge voltage during switching.

In addition, the positive input terminal P and the negative input terminal N can be reduced in inductance.

Furthermore, a cooling device for an inverter INV can be reduced in dimensions and costs since using the low-loss power module makes it possible to reduce the amount of heat generated therefrom.

Moreover, the arms may be stored into independent modules for each phase (two-in-one moduling) or all arms may be stored into one module (six-in-one moduling).

Next, circuit composition of a power module according to a sixth embodiment of the present invention is described below by using FIG. 9. A configuration of a vehicle with a vehicular electric machine system according to the present embodiment is essentially the same as the configuration shown in FIG. 1. Also, circuit composition of an inverter INV in the vehicular electric machine system according to the present embodiment is essentially the same as the composition shown in FIG. 2.

Figure 9:
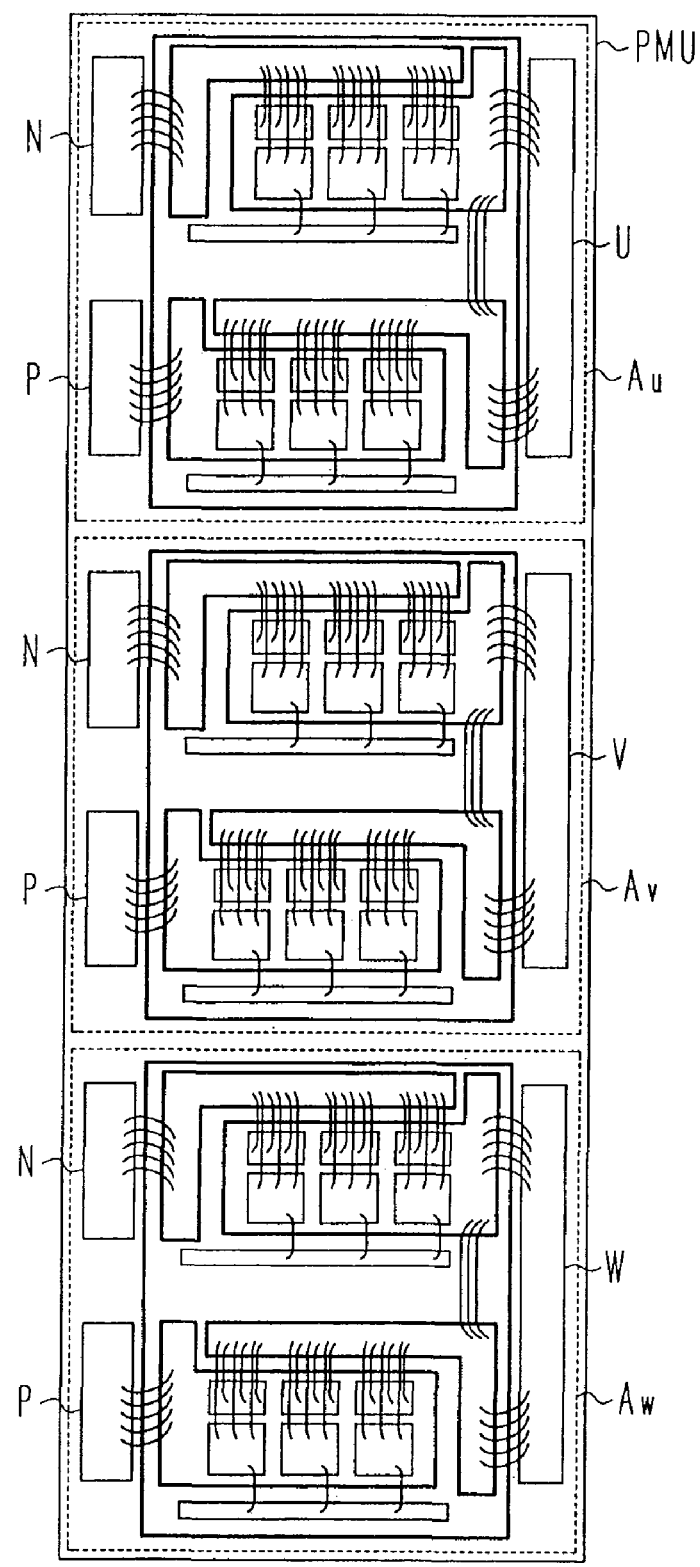
FIG. 9 is a plan view showing a configuration of a U-phase (V-phase, W-phase) arm "Au" ("Av", "Aw") of a power module PMU used in a vehicular electric machine system according to a sixth embodiment of the invention.

FIG. 9 is a plan view showing a configuration of the power module PMU used in the vehicular electric machine system of the present embodiment. The same reference numbers and symbols as used in FIGS. 1 to 5 denote the same elements.

The present embodiment employs six-in-one moduling in which all arms "Au", "Av", "Aw" are stored in one power module PMU. Therefore, this moduling method allows dimensional reduction, compared with the embodiment of FIG. 5 storing into one module and connecting three arms as the U-phase, V-phase, and W-phase arms.

FIG. 9 shows an example of storing all three-phase arms "Au", "Av", "Aw" into one module, and this moduling form can be implemented by, as shown in FIG. 5, storing the arms in phase-by-phase form into one module. Alternatively, however, the format shown in FIG. 3, 6, 7, or 8 can be used for single moduling of each phase arm.

As described above, parasitic inductance of an output terminal section can also be reduced in the present embodiment, so it is possible to provide a low-loss, highly noise immune, and highly reliable power module capable of reducing a surge voltage during switching.

In addition, the power module can be miniaturized.

Furthermore, a cooling device for an inverter INV can be reduced in dimensions and costs since using the low-loss power module makes it possible to reduce the amount of heat generated therefrom.

Next, another example of a vehicle configuration with the vehicular electric machine system according to any one of the above embodiments is described below by using FIG. 10. The vehicle in the present example is a hybrid electric vehicle having two different sources of electrical energy.

Figure 10:
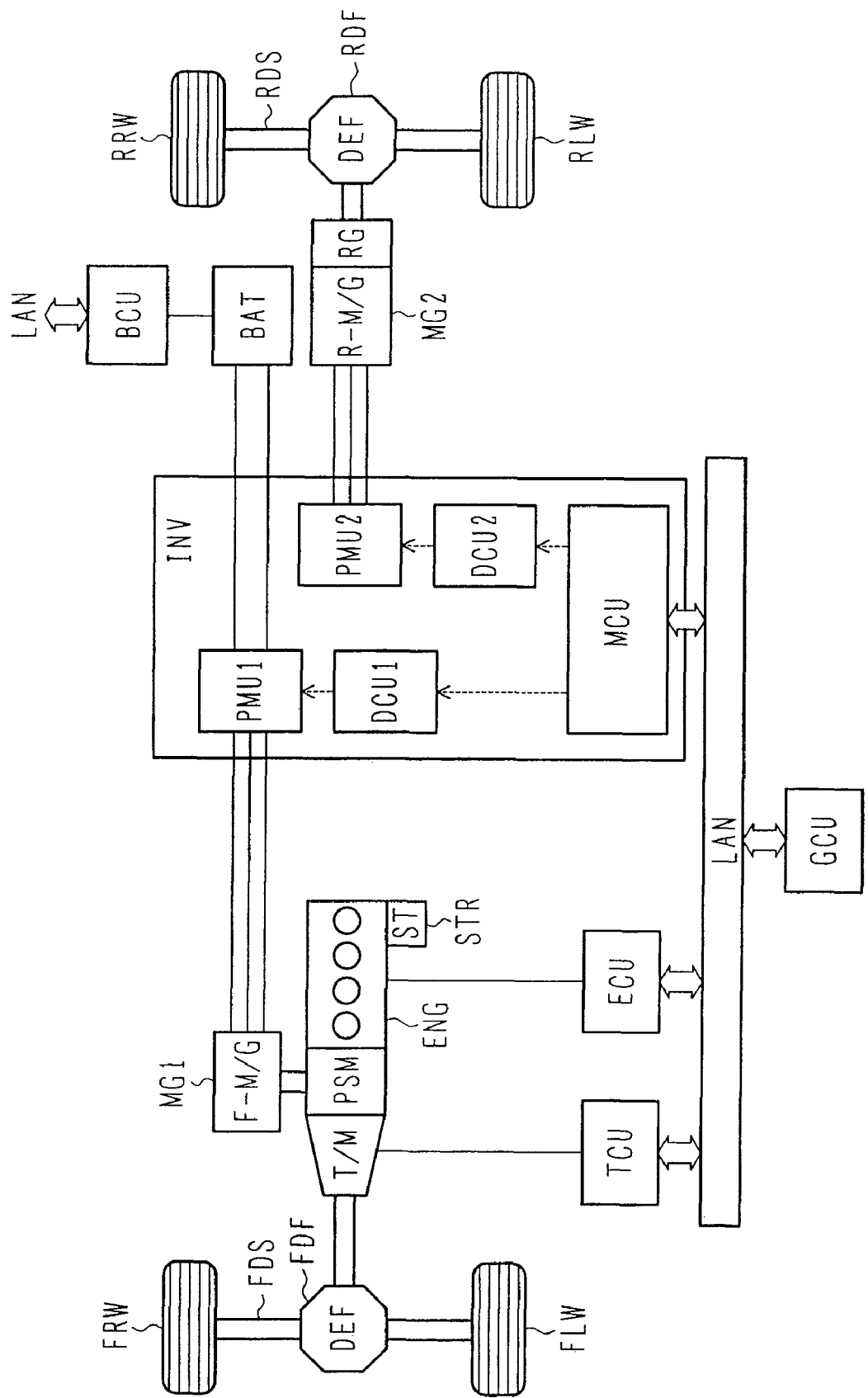
FIG. 10 is a system block diagram that shows another vehicle configuration having the vehicular electric machine system according to any one of the above embodiments of the invention.

FIG. 10 is a system block diagram showing the vehicle configuration.

The hybrid electric vehicle in the present example is of a four-wheel drive type constructed so that front wheels FLW, FRW are driven by an internal combustion engine ENG and a motor generator MG1, and rear wheels RLW, RRW, by a motor generator MG2. While the present example described below uses the engine ENG and the motor generator MG1 to drive the front wheels FLW, FRW and uses the motor generator MG2 to drive the rear wheels RLW, RRW, the front wheels FLW, FRW may be driven by the motor generator MG1, and the rear wheels RLW, RRW, by the engine ENG and the motor generator MG2.

A transmission machine T/M is mechanically connected to front-wheel driving shafts FDS' of the front wheels FLW, FRW via a front differential gear FDF. The motor generator MG1 and the engine ENG are mechanically connected to the transmission machine T/M via an engine power distribution mechanism PSM. The engine power distribution mechanism PSM undertakes synthesis of rotational driving force as well as distribution thereof. An alternating-current (AC) side of an inverter INV is electrically connected to stator coils of the motor generator MG1. The inverter INV is a power converter for converting direct-current (DC) power into three-phase AC power, and controls driving of the motor generator MG1. A battery BAT is electrically connected to a DC side of the inverter INV.

A motor generator MG2 is mechanically connected to rear-wheel driving shafts RDS' of the rear wheels RLW, RRW via a rear differential gear RDF and a reduction gear RG. An AC side of an inverter INV is electrically connected to stator coils of the motor generator MG2. The inverter INV here is common to the motor generators MG1, MG2, and has a power module PMU1 and drive circuit unit DCU1 for the motor generator MG1, a power module PMU2 and drive circuit unit DCU2 for the motor generator MG2, and a motor control unit MCU.

The engine ENG has a starting motor STR. The starting motor STR starts the engine ENG.

An engine control unit ECU receives input signals from elements such as sensors and other control units, and uses each received input signal to compute control values for operating a throttle valve, a fuel injector, and other components of the engine ENG. The control values are output as control signals to engine component drive units. Thus, operations of components of the engine ENG are controlled.

Operation of the transmission machine T/M is controlled by a transmission machine control unit TCU. The transmission machine control unit TCU receives input signals from the elements such as sensors and other control units, and uses each received input signal to compute control values for operating a transmission mechanism of the transmission machine T/M. The control values are output as control signals to a drive unit of the transmission mechanism. Thus, operation of the transmission mechanism of the transmission machine T/M is controlled.

The battery BAT is a lithium-ion battery with a battery voltage of 200 V or more, and charging/discharging of the battery and a life and other factors thereof are managed by a battery control unit BCU. A voltage value of the battery BAT and a current value and other values thereof are input to the battery control unit BCU, and these values are input for the charging/discharging and life management of the battery. Although omitted from FIG. 10, a low-voltage battery with a battery voltage of 12 V is also mounted as another battery, which is used as a power supply for a control system, a radio, lights, and more.

The engine control unit ECU, the transmission machine control unit TCU, the motor control unit MCU, and the battery control unit BCU are electrically connected to one another via a local area network LAN for the vehicle. The four control units are also electrically connected to a general control unit GCU. Thus, bi-directional signal transmission between the control units becomes possible, and this, in turn, allows mutual information transmission and sensor data sharing between the control units. The general control unit GCU outputs command signals to each control unit according to a particular operating state of the vehicle. For example, the general control unit GCU calculates a torque value required of the vehicle according to an accelerator-pedaling stroke based on an accelerating request of a person who drives the vehicle, and distributes the thus-calculated torque requirement into an output torque value of the engine ENG and an output torque value of the motor generator MG1 so that the engine ENG improves in running efficiency. After the distribution, the output torque value of the engine ENG is output as an engine torque command signal to the engine control unit ECU, and the output torque value of the motor generator MG1 is output as a motor torque command signal to the motor control unit MCU.

The following describes operation of the hybrid electric vehicle in the present example:

During a start of the hybrid electric vehicle and during low-speed traveling thereof (in a traveling speed region that causes the engine ENG to decrease in running efficiency, that is, fuel efficiency), the vehicle uses the motor generator MG1 to drive the front wheels FLW, FRW. While the operation of driving the front wheels FLW, FRW by the motor generator MG1 during the start and low-speed traveling of the hybrid electric vehicle is described in the present example, the vehicle may employ a four-wheel drive traveling scheme so that the front wheels FLW, FRW are driven by the motor generator MG1, and the rear wheels RLW, RRW by the motor generator MG2. DC power is supplied from the battery BAT to the inverter INV. Supplied DC power is converted into three-phase AC power by the inverter INV. The thus-obtained three-phase AC power is supplied to the stator coils of the motor generator MG1. Thus, the motor generator MG1 is driven to generate an engine speed output. The generated engine speed output is input to the transmission machine T/M via the engine power distribution mechanism PSM. The input engine speed output is changed by the transmission machine T/M and then distributed and transmitted to the front-wheel driving shafts FDS' of the front left wheel FLW and the front right wheel FRW via the front differential gear FDF. This rotationally drives the front-wheel driving shafts FDS', and the rotational driving of the front-wheel driving shafts FDS' rotationally drives the front wheels FLW, FRW.

When the hybrid electric vehicle travels under normal conditions (traveling a dry road and in a traveling speed region that causes the engine ENG to improve in running efficiency, that is, fuel efficiency), the vehicle uses the engine ENG to drive the front wheels FLW, FRW. Accordingly, the engine speed output is input to the transmission machine T/M via the engine power distribution mechanism PSM. The input engine speed output is changed by the transmission machine T/M, then distributed and transmitted to the front-wheel driving shafts FDS' via the front differential gear FDF. This rotationally drives the front wheels FLW, FRW. In addition, when there is a need to detect a charge state of the battery BAT and recharge the battery, the engine speed output is distributed to the motor generator MG1 via the engine power distribution mechanism PSM, thus rotationally driving the motor generator MG1. Thus, the motor generator MG1 operates as an electric power generator. The operation of the motor generator MG1 generates three-phase AC power in the stator coils of the motor generator. The generated three-phase AC power is converted into required DC power by the inverter INV. The DC power that has been obtained by the conversion is supplied to the battery BAT. The battery BAT is thus recharged.

During four-wheel drive traveling of the hybrid electric vehicle (traveling a low-u road such as a snow-covered road, and in a traveling speed region of high engine running efficiency, that is, high fuel efficiency), the vehicle activates the motor generator MG2 to drive the rear wheels RLW, RRW. Also, four-wheel drive traveling causes the engine ENG to drive the front wheels FLW, FRW, as under the normal traveling conditions described above. Additionally, since the driving of the motor generator MG1 reduces the amount of electrical energy stored in the battery BAT, an engine speed output of the engine ENG rotationally drives the motor generator MG1 to recharge the battery BAT. In order for the motor generator MG2 to drive the rear wheels RLW, RRW, DC power is supplied from the battery BAT to the inverter INV. Supplied DC power is converted into three-phase AC power by the inverter INV. Three-phase AC power that has been obtained by the conversion is supplied to stator coils of the motor generator MG2. Thus, the motor generator MG2 is driven to generate an engine speed output. The generated engine speed output is reduced by the reduction gear RG and input to the rear differential gear RDF. The input engine speed output is distributed and transmitted to the rear-wheel driving shafts RDS' of the rear left wheel RLW and the rear right wheel RRW by the rear differential gear RDF. This rotationally drives the rear-wheel driving shafts RDS', and the rotational driving of the rear-wheel driving shafts RDS' rotationally drives the rear wheels RLW, RRW.

During acceleration of the hybrid electric vehicle, the engine ENG and the motor generator MG1 drive the front wheels FLW, FRW. While the operation of driving the front wheels FLW, FRW in coordination between the engine ENG and the motor generator MG1 during the acceleration of the hybrid electric vehicle is described in the present example, the vehicle may employ the four-wheel drive traveling scheme so that the front wheels FLW, FRW are driven by the motor generator MG2, and the rear wheels RLW, RRW by the motor generator MG2. An engine speed output by the engine ENG and the motor generator MG1 is input to the transmission machine T/M via the engine power distribution mechanism PSM. The input engine speed output is changed by the transmission machine T/M and then transmitted to the front-wheel driving shafts FDS' via the front differential gear FDF. Thus, the front wheels FLW, FRW are rotationally driven.

During regenerative control of the hybrid electric vehicle (for decelerating the vehicle by, for example, stepping on a foot brake pedal, reducing a foot pressure applied to an accelerator pedal, or stopping the accelerator pedaling operations), torques of the front wheels FLW, FRW are transmitted to the motor generator MG1 via the front-wheel driving shafts FDS', the front differential gear FDF, the transmission machine T/M, and the engine power distribution mechanism PSM, thus rotationally driving the motor generator MG1. The motor generator MG1 then operates as an electric power generator. The operation of the motor generator MG1 generates three-phase AC power in the stator coils of the motor generator. The generated three-phase AC power is converted into required DC power by the inverter INV. The DC power that has been obtained by the conversion is supplied to the battery BAT. The battery BATT is thus recharged. Meanwhile, torques of the rear wheels RLW, RRW are transmitted to the motor generator MG2 via the rear-wheel driving shafts RDS', the rear differential gear RDF, and the reduction gear RG, thus rotationally driving the motor generator MG2. The motor generator MG2 then operates as an electric power generator. The operation of the motor generator MG2 generates three-phase AC power in the stator coils of the motor generator. The generated three-phase AC power is converted into the required DC power by the inverter INV. The DC power that has been obtained by the conversion is supplied to the battery BATT. The battery BATT is thus recharged.

As set forth above, according to the present invention, since the parasitic inductance of the output terminal section can be reduced, it is possible to provide a low-loss, highly noise immune, and highly reliable power module capable of reducing the surge voltage occurring during switching.

The present invention also makes it possible to provide an electric power converter having the above power module circuit between a driving section and a vehicular rotating electric machine.

In addition, the present invention makes it possible to provide a vehicular electric machine system having the above power converter.

What is claimed is:

1. A power module for converting DC power into AC power, the module comprising:
    a positive input terminal connected to a positive terminal of a DC power supply;
    a negative input terminal connected to a negative terminal of the DC power supply;
    an output terminal formed to output the AC power;
    a positive power semiconductor element for switching;
    a first conductor electrically connected to a current suction electrode portion of said positive power semiconductor element;
    a control terminal for controlling a negative power semiconductor element;
    a second conductor electrically connected to a current suction electrode portion of said negative power semiconductor element;
    a third conductor electrically connected to a current discharge electrode portion of said positive power semiconductor element; and
    a fourth conductor electrically connected to a current discharge electrode portion of said negative power semiconductor element;
    wherein:
        said positive input terminal and said first conductor are electrically interconnected;
        said negative input terminal and said fourth conductor are electrically interconnected;
        said third conductor is electrically connected to said output terminal;
        said second conductor is electrically connected to said output terminal; and
        said third conductor is further electrically connected to said second conductor.

2. The power module according to claim 1, wherein: said third conductor is electrically connected to said second conductor via a wire-shaped conductor.

3. The power module according to claim 1, wherein: said third conductor and said second conductor are integrally formed.

4. The power module according to claim 1, wherein: said third conductor is electrically connected to said second conductor via a plate-shaped conductor.

5. The power module according to claim 1, further comprising:
    a dielectric substrate supporting said first conductor, said second conductor, said third conductor, and said fourth conductor.

6. The power module according to claim 1, further comprising:
    a first dielectric substrate supporting said first conductor and said third conductor; and
    a second dielectric substrate supporting said second conductor and said fourth conductor.

7. The power module according to claim 1, wherein: said positive input terminal and said negative input terminal are stacked upon each other under an electrically insulated condition.

8. A power module for converting DC power into AC power, the module comprising:
    a positive input terminal connected to a positive terminal of a DC power supply;
    a negative input terminal connected to a negative terminal of the DC power supply;
    an output terminal formed to output the AC power;
    a positive power semiconductor element for switching;
    a negative power semiconductor element for switching; and
    means for reducing inductance developed at an interconnection section between a current discharge electrode portion of said positive power semiconductor element, a current suction electrode portion of said negative power semiconductor element, and said output terminal.

9. The power module according to claim 8, wherein said inductance reduction means is adapted to:
    electrically connect a positive discharge electrode conductor previously connected to the current discharge electrode portion of said positive power semiconductor element, and said output terminal;

electrically connect a negative suction electrode conductor previously connected to the current suction electrode portion of said negative power semiconductor element, and said output terminal; and electrically connect the positive discharge electrode conductor previously connected to the current discharge electrode portion of said positive power semiconductor element, and the negative suction electrode conductor previously connected to the current suction electrode portion of said negative power semiconductor element.

10. A power module for converting DC power into AC power, the module comprising:

a positive input terminal connected to a positive terminal of a DC power supply;

a negative input terminal connected to a negative terminal of the DC power supply;

an output terminal formed to output the AC power;

a positive power semiconductor element for switching;

a negative power semiconductor element for switching; and a connection conductor;

wherein said connection conductor is adapted to:

electrically connect a positive discharge electrode conductor previously connected to a current discharge electrode portion of said positive power semiconductor element, and said output terminal;

electrically connect a negative suction electrode conductor previously connected to a current suction electrode portion of said negative power semiconductor element, and said output terminal;

ensure that the positive discharge electrode conductor and the negative suction electrode conductor are disposed in parallel to each other; and ensure that said output terminal extends vertically with respect to a direction in which the positive discharge electrode conductor and the negative suction electrode conductor extend; and wherein said connection conductor provided in parallel to said output terminal, at a position neighboring said output terminal, is further adapted to electrically connect the positive discharge electrode conductor previously connected to the current discharge electrode portion of said positive power semiconductor element, and the negative suction electrode conductor previously connected to the current suction electrode portion of said negative power semiconductor element.

11. An electric power converter which receives a supply of electric power from a power supply source and after converting the power into required power, outputs the power, the converter comprising:

a power module with a switching power semiconductor element;

a controller which outputs a control signal to control operation of the switching power semiconductor element; and a driver which, after receiving the control signal, outputs to said power module a driving signal for operating the switching power semiconductor element;

wherein:

said third conductor is further electrically connected to said second conductor; and the driving signal operates the switching power semiconductor element, whereby the power supplied from the power supply source is converted into the required power.

12. An electric machine system for mounting in a vehicle, adapted to convert a supply of electric power from a power supply mounted in the vehicle, into motor power, the system comprising:

a motor which generates the motor power; and an electric power converter controlling the power supplied from the vehicle-mounted power supply, said power converter supplying the controlled power to said motor;

the system further comprising:

a power module with a switching power semiconductor element;

a controller which outputs a control signal to control operation of the switching power semiconductor element; and a driver which, after receiving the control signal, outputs to said power module a driving signal for operating the switching power semiconductor element;

wherein:

said power module includes a positive input terminal connected to a positive terminal of a DC power supply, a negative input terminal connected to a negative terminal of the DC power supply, an output terminal formed to output AC power, a positive power semiconductor element for switching, a first conductor electrically connected to a current suction electrode portion of the positive power semiconductor element, a negative power semiconductor element for switching, a second conductor electrically connected to a current suction electrode portion of the negative power semiconductor element, a third conductor electrically connected to a current discharge electrode portion of the positive power semiconductor element, and a fourth conductor electrically connected to a current discharge electrode portion of the negative power semiconductor element; wherein, said positive input terminal and said first conductor are electrically interconnected;

said negative input terminal and said fourth conductor are electrically interconnected;

said third conductor is electrically connected to the output terminal, said second conductor is electrically connected to the output terminal, and said third conductor is further electrically connected to said second conductor;

the driving signal operates the switching power semiconductor element, whereby the power supplied from the power supply source is converted into the required power; and said motor generates driving force by using the power supplied from said power module.

* * * * *